United States Patent
Lu et al.

(10) Patent No.: US 10,068,770 B2
(45) Date of Patent: Sep. 4, 2018

(54) METHOD AND STRUCTURE FOR SEMICONDUCTOR DEVICE HAVING GATE SPACER PROTECTION LAYER

(71) Applicant: Taiwan Semiconductor Manufacturing Company, Ltd., Hsin-Chu (TW)

(72) Inventors: Chih Wei Lu, Hsinchu (TW); Chung-Ju Lee, Hsinchu (TW); Hai-Ching Chen, Hsinchu (TW); Chien-Hua Huang, Miaoli County (TW); Tien-I Bao, Taoyuan County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/820,961

(22) Filed: Nov. 22, 2017

(65) Prior Publication Data

US 2018/0096850 A1    Apr. 5, 2018

Related U.S. Application Data

(62) Division of application No. 14/830,089, filed on Aug. 19, 2015, now Pat. No. 9,831,090.

(51) Int. Cl.
*H01L 21/70* (2006.01)
*H01L 29/76* (2006.01)
(Continued)

(52) U.S. Cl.
CPC .. *H01L 21/28132* (2013.01); *H01L 21/28088* (2013.01); *H01L 21/76895* (2013.01); *H01L 23/485* (2013.01); *H01L 29/4966* (2013.01)

(58) Field of Classification Search
CPC ......... H01L 21/28132; H01L 21/28088; H01L 21/76895; H01L 29/4966
(Continued)

(56) References Cited

U.S. PATENT DOCUMENTS

| 6,107,667 A | 8/2000 | An et al. |
| 6,888,198 B1 | 5/2005 | Krivokapic |

(Continued)

FOREIGN PATENT DOCUMENTS

| KR | 20120067712 | 6/2012 |
| KR | 20140106239 | 9/2014 |

OTHER PUBLICATIONS

Korean Office Action—Translated, Korean Application No. 10-2015-0143302 dated Oct. 26, 2016, 11 pages.
(Continued)

*Primary Examiner* — Dzung Tran
(74) *Attorney, Agent, or Firm* — Haynes and Boone, LLP

(57) ABSTRACT

A method of forming a semiconductor device includes providing a precursor. The precursor includes a substrate; a gate stack over the substrate; a first dielectric layer over the gate stack; a gate spacer on sidewalls of the gate stack and on sidewalls of the first dielectric layer; and source and drain (S/D) contacts on opposing sides of the gate stack. The method further includes recessing the gate spacer to at least partially expose the sidewalls of the first dielectric layer but not to expose the sidewalls of the gate stack. The method further includes forming a spacer protection layer over the gate spacer, the first dielectric layer, and the S/D contacts.

20 Claims, 14 Drawing Sheets

(51) Int. Cl.
*H01L 29/66* (2006.01)
*H01L 23/48* (2006.01)
*H01L 21/28* (2006.01)
*H01L 29/49* (2006.01)
*H01L 21/768* (2006.01)
*H01L 23/485* (2006.01)

(58) Field of Classification Search
USPC .............................. 257/407, 288, 330, 742
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,900,944 B2 | 12/2014 | Jeong et al. | |
| 2005/0095797 A1 | 5/2005 | Cho et al. | |
| 2006/0065914 A1 | 3/2006 | Chen et al. | |
| 2008/0012070 A1 | 1/2008 | Juengling | |
| 2010/0224937 A1 | 9/2010 | Sridhar | |
| 2010/0244155 A1 | 9/2010 | Carter et al. | |
| 2012/0156867 A1 | 6/2012 | Jeong et al. | |
| 2012/0248508 A1* | 10/2012 | Ponoth | H01L 21/76897 |
| | | | 257/288 |
| 2013/0248927 A1 | 9/2013 | Wu et al. | |
| 2013/0320415 A1 | 12/2013 | Javorka et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2017/0053804 A1 | 2/2017 | Lu et al. | |

OTHER PUBLICATIONS

German Office Action dated Feb. 4, 2016 for Application No. 10-2015-114790, 8 pages.

* cited by examiner

METHOD AND STRUCTURE FOR SEMICONDUCTOR DEVICE HAVING GATE SPACER PROTECTION LAYER

PRIORITY DATA

The present application is a divisional application of U.S. application Ser. No. 14/830,089, filed Aug. 19, 2015, which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, a field effect transistor (FET) typically includes source and drain (S/D) features disposed on opposing sides of a gate stack. The gate stack is surrounded by a gate spacer for protecting the gate stack as well as improving the gate stack's electrical performance. However, the gate spacer is frequently damaged in subsequent manufacturing processes, such as mid-end-of-line (MEOL) processes. For example, photolithography and etching processes are used for defining and etching holes for S/D and gate vias (or plugs). The holes are sometimes misaligned with the underlying targets due to photolithography overlay errors. Consequently, the etching processes remove not only the target material but also a part of the gate spacer. This leads to degradation of the gate stack's performance, shorting of the S/D vias with the gate stack, and other reliability issues and defects in the IC device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
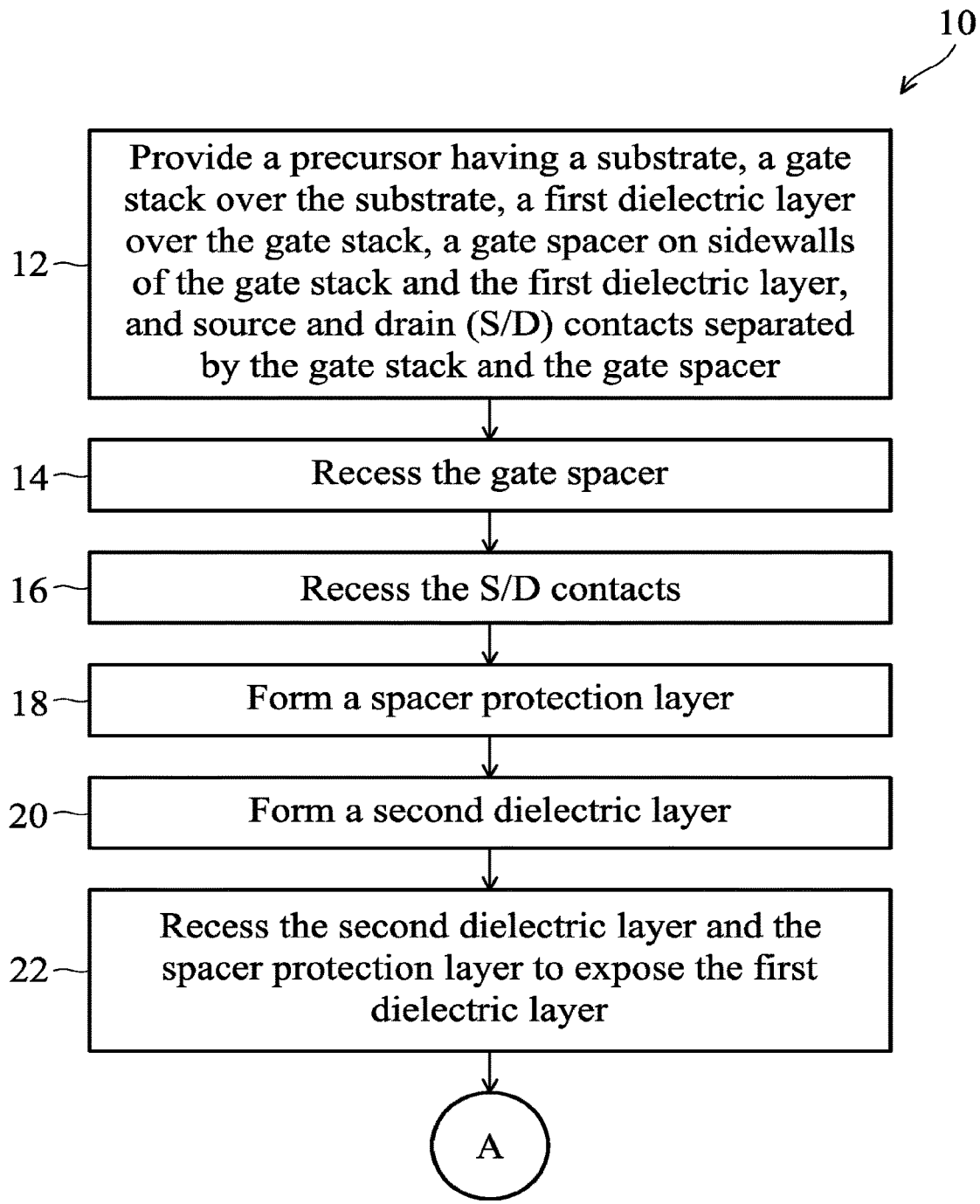
FIGS. 1A and 1B are a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to semiconductor devices having gate spacers and a protection layer over the gate spacers. One object of the present disclosure is to provide protection to gate spacers during source, drain, and gate via hole etching processes. In today's photolithography processes, overlay errors are difficult, if not impossible, to avoid. Frequently, the via hole etching processes also partially remove the gate spacers. This leads to degradation of the gate's electrical performance, shorting source and drain vias to gates, and other issues. The provided subject matter addresses such issues and provides immediate benefits to both device fabrication and process control.

Figure 1B:
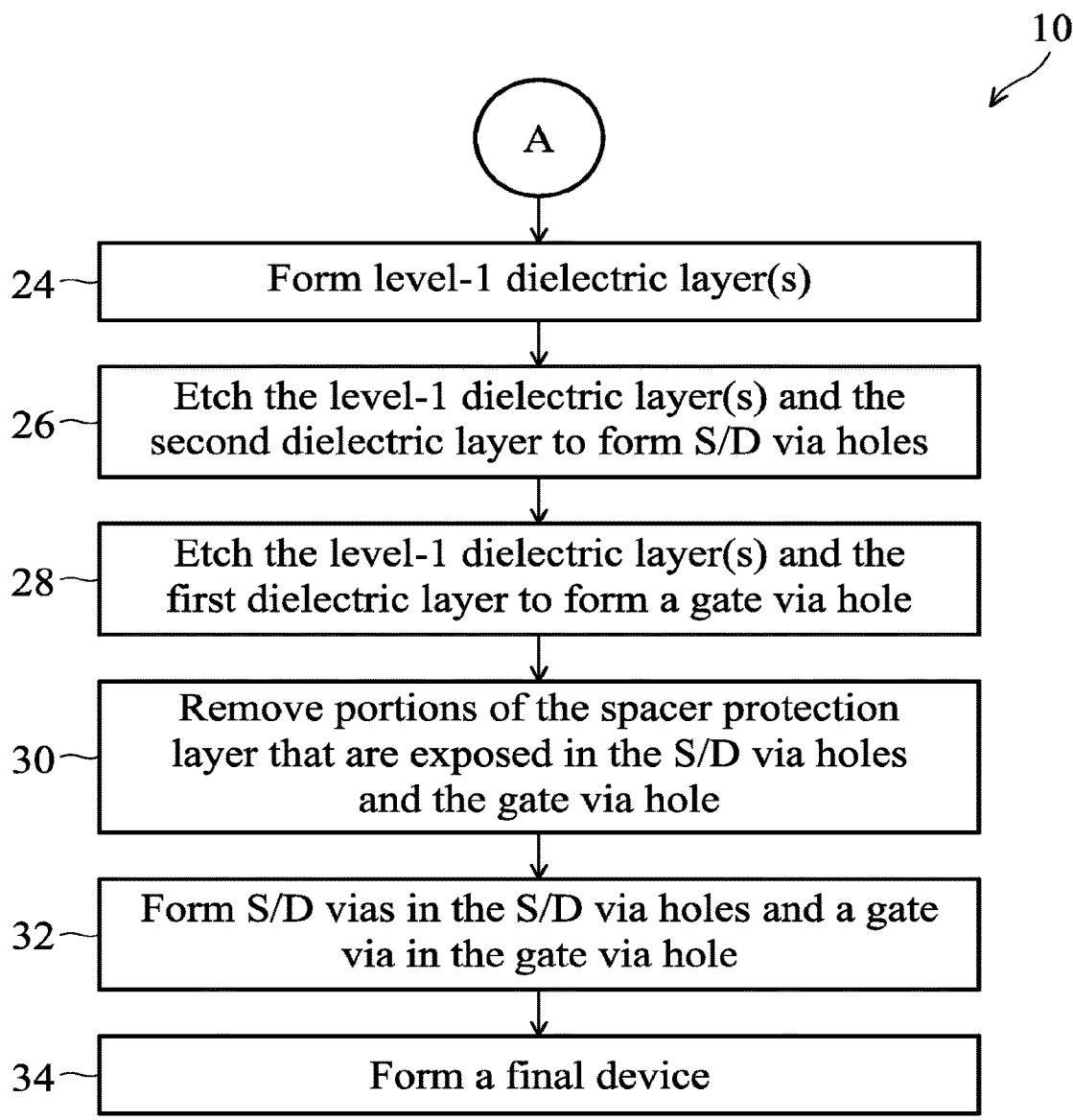

FIGS. 1A and 1B show a flow chart of a method 10 of forming a semiconductor device 100 having a spacer protection layer over gate spacers, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-2L which are cross-sectional views of the semiconductor device 100 in various stages of a manufacturing process.

The semiconductor device 100 is provided for illustration purposes and does not necessarily limit the embodiments of the present disclosure to any number of devices, any number of regions, or any configuration of structures or regions. Furthermore, the semiconductor device 100 as shown in FIGS. 2A-2L may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2A:
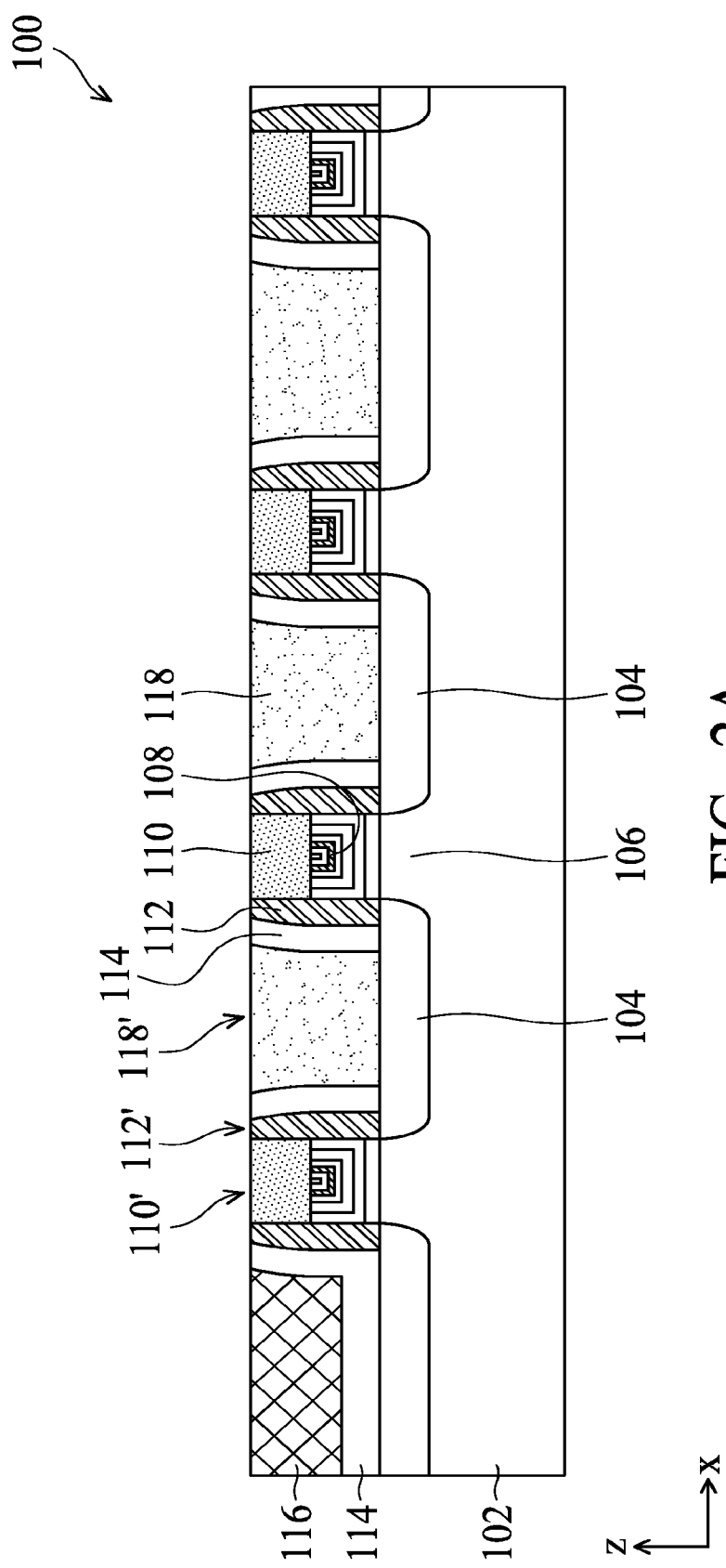
FIGS. 2A, 2B, 2C, 2D, 2E, 2F, 2G, 2H, 2I, 2J, 2K, and 2L are cross-sectional views of a portion of a semiconductor device constructed according to the method in FIGS. 1A and 1B, in accordance with an embodiment.

At operation 12, the method 10 (FIG. 1A) provides a precursor of the device 100 as shown in FIG. 2A. For the convenience of discussion, the precursor of the device 100 is also referred to as the device 100. Referring to FIG. 2A, the device 100 includes a substrate 102 and various features formed therein or thereon. The substrate 102 includes various source and drain (S/D) regions 104 and channel regions 106 between the S/D regions 104. The device 100 further includes a plurality of gate stacks 108 disposed adjacent to the channel regions 106, a dielectric layer 110 disposed over each gate stack 108, and a gate spacer 112 on sidewalls of each gate stack 108 and on sidewalls of the respective dielectric layer 110. In the present embodiment, the device 100 further includes a contact etch stop (CES) layer 114 over the substrate 102 and on sidewalls of the gate spacer 112, and an inter-layer dielectric (ILD) layer 116 over the CES layer 114. The device 100 further includes S/D contacts 118 over the S/D regions 104 and in electrical communication with the S/D regions 104. The various features (or components) of the device 100 are further described below.

The substrate 102 is a silicon substrate in the present embodiment. In alternative embodiments, the substrate 102 includes other elementary semiconductors such as germanium; a compound semiconductor such as silicon carbide, gallium arsenide, indium arsenide, and indium phosphide; or an alloy semiconductor, such as silicon germanium carbide, gallium arsenic phosphide, and gallium indium phosphide. In embodiments, the substrate 102 may include silicon on insulator (SOI) substrate, be strained and/or stressed for performance enhancement, include epitaxial regions, include isolation regions, include doped regions, and/or include other suitable features and layers.

The S/D regions 104 may include heavily doped S/D (HDD), lightly doped S/D (LDD), raised regions, strained regions, epitaxially grown regions, and/or other suitable features. The S/D regions 104 may be formed by etching and epitaxial growth, halo implantation, S/D implantation, S/D activation, and/or other suitable processes. In an embodiment, the S/D regions 104 may further include silicidation. For example, silicidation may be formed by a process that includes depositing a metal layer, annealing the metal layer such that the metal layer is able to react with silicon to form silicide, and then removing the non-reacted metal layer. In an embodiment, the substrate 102 includes fin-like active regions for forming multi-gate FETs such as FinFETs. To further this embodiment, the S/D regions 104 and the channel regions 106 may be formed in or on the fins.

The channel regions 106 are sandwiched between a pair of S/D regions 104. The channel region 106 conducts currents between the respective S/D regions 104 when the semiconductor device 100 is in use.

The gate stack 108 is disposed adjacent to the channel region 106. The gate stack 108 is a multi-layer structure. In an embodiment, the gate stack 108 includes an interfacial layer, a gate dielectric layer, a work function metal layer, and a metal fill layer. The interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The gate dielectric layer may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The work function metal layer may be a p-type or an n-type work function layer. The p-type work function layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function layer comprises a metal selected from, but not limited to, the group of titanium (Ti), aluminum (Al), tantalum carbide (TaC), tantalum carbide nitride (TaCN), tantalum silicon nitride (TaSiN), or combinations thereof. The work function metal layer may include a plurality of layers and may be deposited by CVD, PVD, and/or other suitable process. The metal fill layer may include aluminum (Al), tungsten (W), cobalt (Co), copper (Cu), and/or other suitable materials. The metal fill layer may be formed by CVD, PVD, plating, and/or other suitable processes. The gate stack 108 may be formed in a gate-first process or a gate-last process (i.e., a replacement gate process).

The dielectric layer 110 is disposed over the gate stack 108. In an embodiment, the dielectric layer 110 includes a metal oxide, a metal nitride, or other suitable dielectric materials. For example, the metal oxide may be titanium oxide ($TiO_2$), aluminum oxide ($Al_2O_3$), or other metal oxides. For example, the metal nitride may be titanium nitride (TiN), aluminum nitride (AlN), aluminum oxynitride (AlON), tantalum nitride (TaN), or other metal nitrides. The dielectric layer 110 may be formed over the gate stack 108 by one or more deposition and etching processes.

The gate spacer 112 may be a single layer or multi-layer structure. In an embodiment, the spacer 112 includes a low-k (e.g., k<7) dielectric material. In some embodiments, the gate spacer 112 includes a dielectric material, such as silicon oxide ($SiO_2$), silicon nitride (SiN), silicon oxynitride (SiON), other dielectric material, or combination thereof. In an example, the gate spacer 112 is formed by blanket depositing a first dielectric layer (e.g., a $SiO_2$ layer having a uniform thickness) as a liner layer over the device 100 and a second dielectric layer (e.g., a SiN layer) as a main D-shaped spacer over the first dielectric layer, and then, anisotropically etching to remove portions of the dielectric layers to form the gate spacer 112. In the present embodiment, the gate spacer 112 is disposed on sidewalls of the gate stack 108 and the dielectric layer 110, and serves multiple purposes. For example, it protects the gate stack 108 during various manufacturing processes, serves for offset purposes when the S/D regions 104 are formed in the substrate 102, and helps improve the electrical performance of the gate stack 108.

The CES layer 114 may include a dielectric material such as silicon nitride (SiN), silicon oxide ($SiO_2$), silicon oxynitride (SiON), and/or other materials. The CES layer 114 may be formed by plasma enhanced CVD (PECVD) process and/or other suitable deposition or oxidation processes. The ILD layer 116 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 116 may be deposited by a PECVD process, a flowable CVD (FCVD) process, or other suitable deposition technique. In an embodiment, the CES layer 114 is deposited over the substrate 102 covering various structures thereon, and the ILD layer 116 is deposited over the CES layer 114. Subsequently, the ILD layer 116 and the CES layer 114 are etched back to remove the respective portions over the S/D regions 104, leaving trenches for depositing the S/D contacts 118. As a result, portions of the CES layer 114 remain on the sidewalls of the gate spacer 112.

The S/D contacts 118 are disposed over the S/D regions 104 and are in electrical communication with the S/D regions 104. The S/D contacts 118 are separated by the structure including the gate stack 108, the gate spacer 112, and the CES layer 114. In an embodiment, the S/D contacts 118 include a metal such as aluminum (Al), tungsten (W), copper (Cu), cobalt (Co), combinations thereof, or other suitable conductive material. In an embodiment, the S/D contact metal is deposited using a suitable process, such as CVD, PVD, plating, and/or other suitable processes. After the S/D contact metal is deposited, a chemical mechanical planarization (CMP) process is performed to planarize the top surface of the device 100. As a result, the various layers, including the dielectric layer 110, the gate spacer 112, and the S/D contacts 118, have a co-planar surface. As illustrated in FIG. 2A, a top surface 110' of the dielectric layer 110, a top surface 112' of the gate spacer 112, and a top surface 118' of the S/D contacts 118 are substantially co-planar in the present embodiment.

Figure 2B:
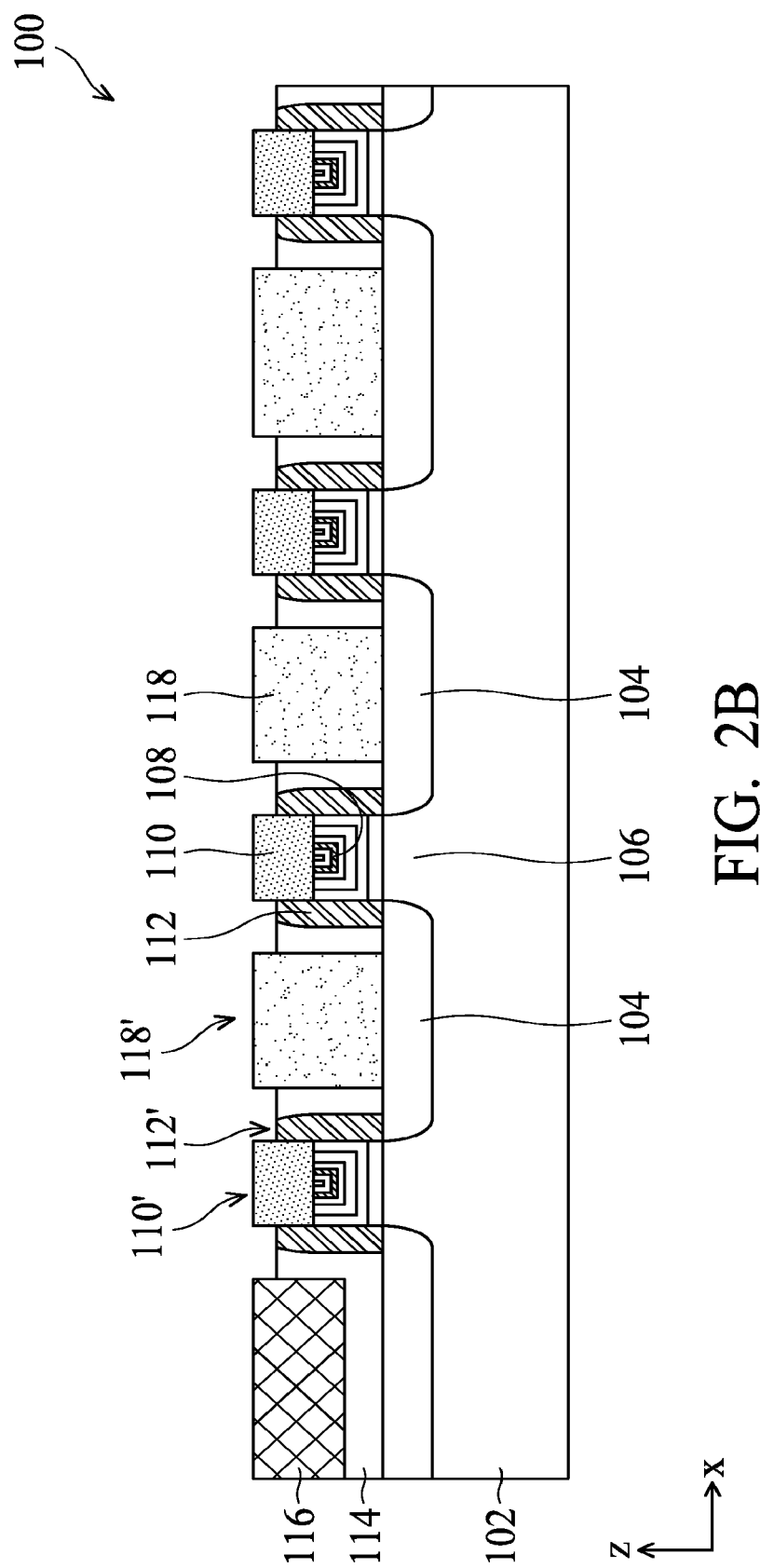

At operation 14, the method 10 (FIG. 1A) recesses the gate spacer 112. Referring to FIG. 2B, in the present embodiment, both the gate spacer 112 and the CES layer 114 are recessed by the operation 14. In embodiments, the operation 14 may use a dry etching, a wet etching, or other suitable etching processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In the present embodiment, the etching process is tuned to selectively remove portions of the gate spacer 112 and the CES layer 114 while the dielectric layer 110, the ILD layer 116, and the S/D contacts 118 remain substantially unchanged. Furthermore, the gate spacer 112 is recessed to expose sidewalls of the dielectric layer 110 but not to expose the sidewalls of the gate stack 108. In another word, the etch-back depth of the gate spacer 112 is less than or equal to the thickness of the dielectric layer 110 (along the "z" direction). In an embodiment, the gate spacer 112 is recessed to fully expose the sidewalls of the dielectric layer 110. As illustrated in FIG. 2B, the top surface 112' of the gate spacer 112 is now below both the top surface 110' of the dielectric layer 110 and the top surface 118' of the S/D contacts 118.

Figure 2C:
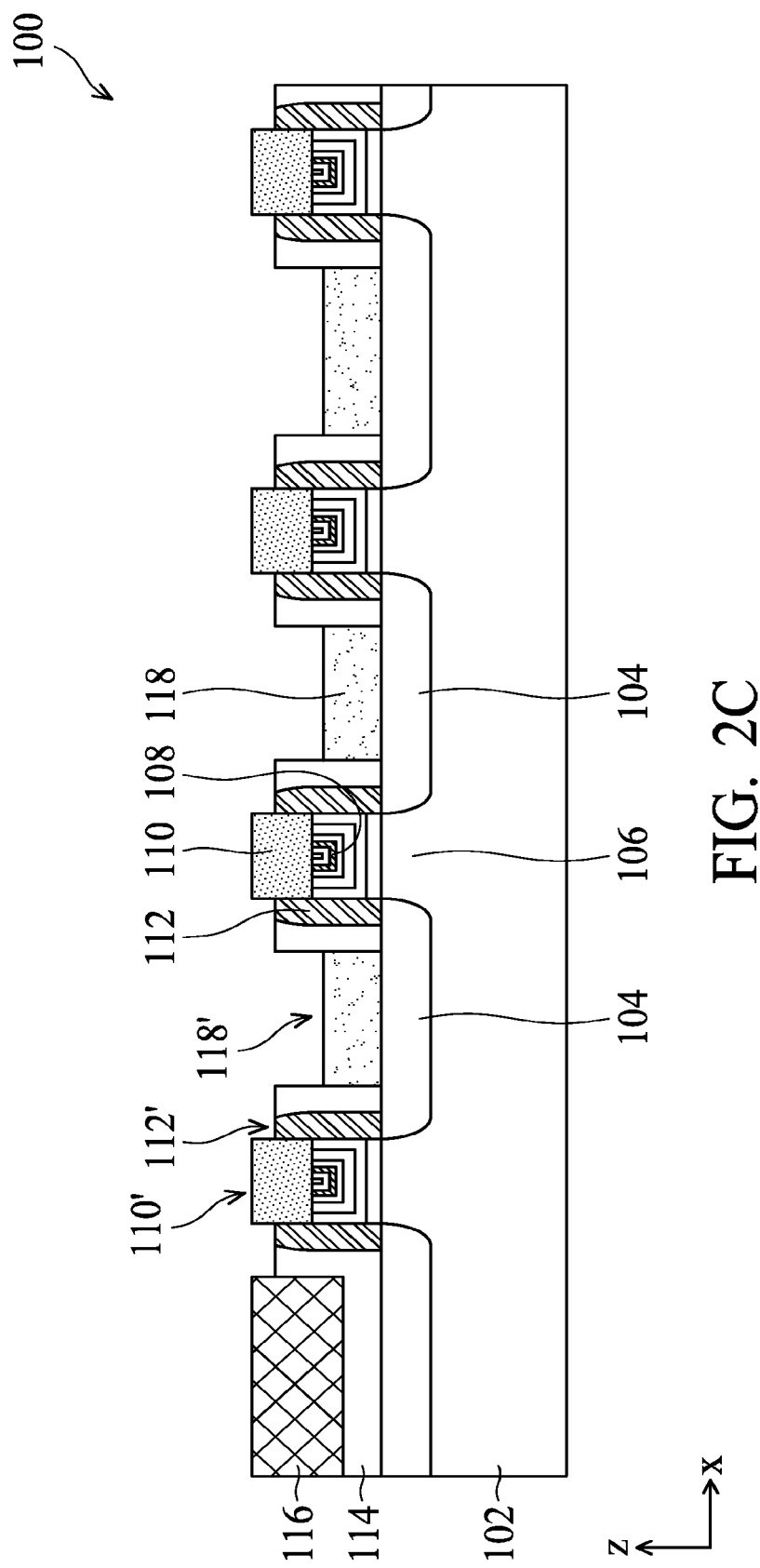

At operation 16, the method 10 (FIG. 1A) recesses the S/D contacts 118. Referring to FIG. 2C, the top surface 118' of the S/D contacts 118 is recessed below the top surface 110' of the dielectric layer 110. In the present embodiment, the top surface 118' of the S/D contacts 118 is also below the top surface 112' of the gate spacer 112. In an alternative embodiment, the top surface 118' of the S/D contacts 118 is above, or at the same level as, the top surface 112' of the gate spacer 112. In yet another embodiment, the top surface 118' of the S/D contacts 118 is recessed below a bottom surface of the dielectric layer 110. The S/D contacts 118 may be recessed by drying etching, wet etching, reactive ion etching, or other suitable etching methods. Further, the etching process is tuned to selectively remove portions of the S/D contacts 118, while other features of the device 100 remain substantially unchanged. In an embodiment of the method 10, operation 16 is optional, i.e., the S/D contact 118 may or may not be recessed prior to operation 18.

Figure 2D:
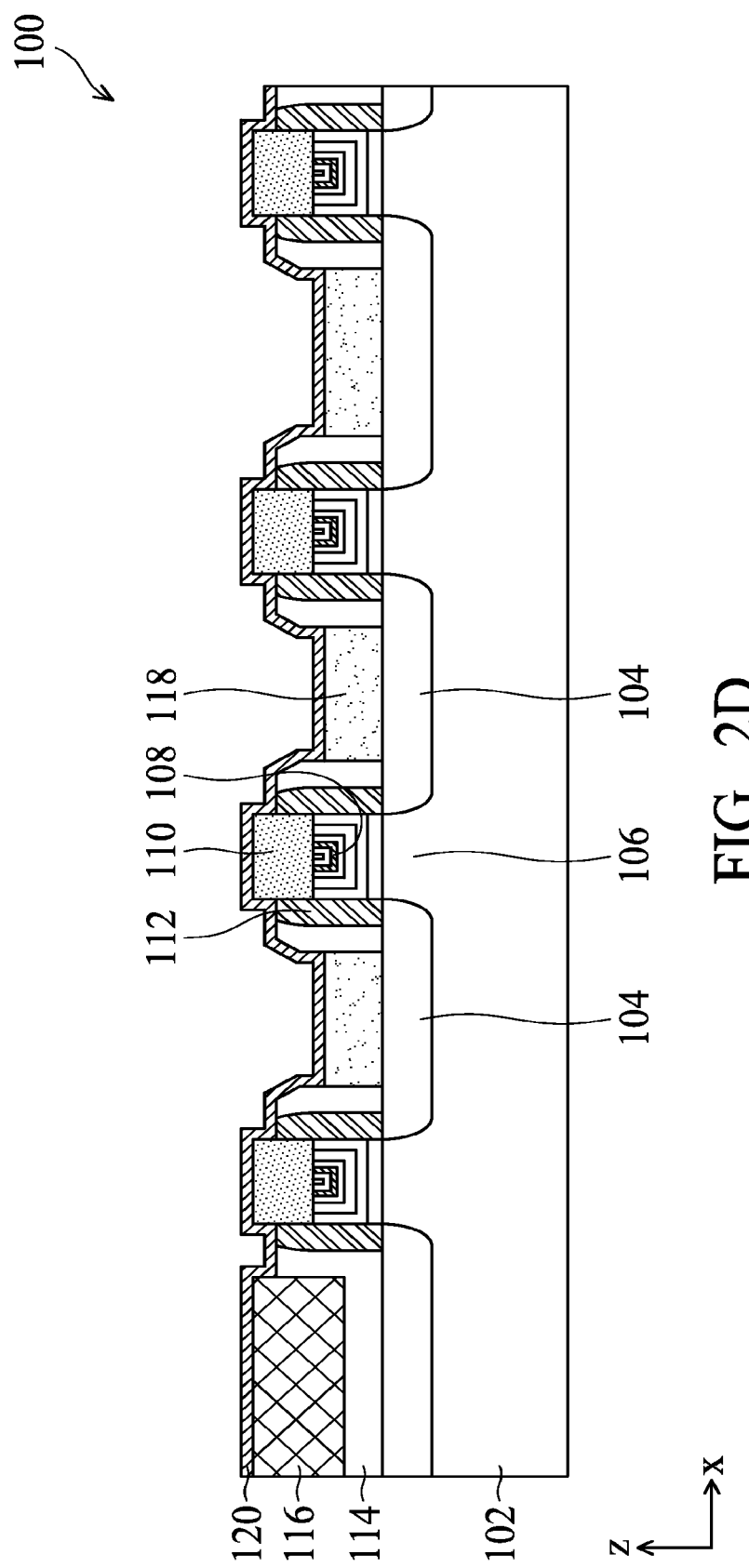

At operation 18, the method 10 (FIG. 1A) forms a spacer protection layer 120 over the device 100. Referring to FIG. 2D, the spacer protection layer 120 covers the top surfaces of the various features 110, 112, 114, 116, and 118. In the present embodiment, the spacer protection layer 120 is a conformal layer, i.e., it has a substantially uniform thickness (in the "x-z" plane). In various embodiments, the spacer protection layer 120 has a thickness ranging from about 10 angstrom (Å) to about 200 Å. The spacer protection layer 120 may include a metal oxide, a metal nitride, or other suitable dielectric materials. For example, the metal oxide may be titanium oxide ($TiO_2$), aluminum oxide ($Al_2O_3$), or other metal oxides. For example, the metal nitride may be titanium nitride (TiN), aluminum nitride (AlN), aluminum oxynitride (AlON), tantalum nitride (TaN), or other metal nitrides. In various embodiments, the spacer protection layer 120 includes a material different from the material of the dielectric layer 110. The spacer protection layer 120 may be formed by ALD, PVD, CVD, or other suitable deposition methods.

Figure 2E:
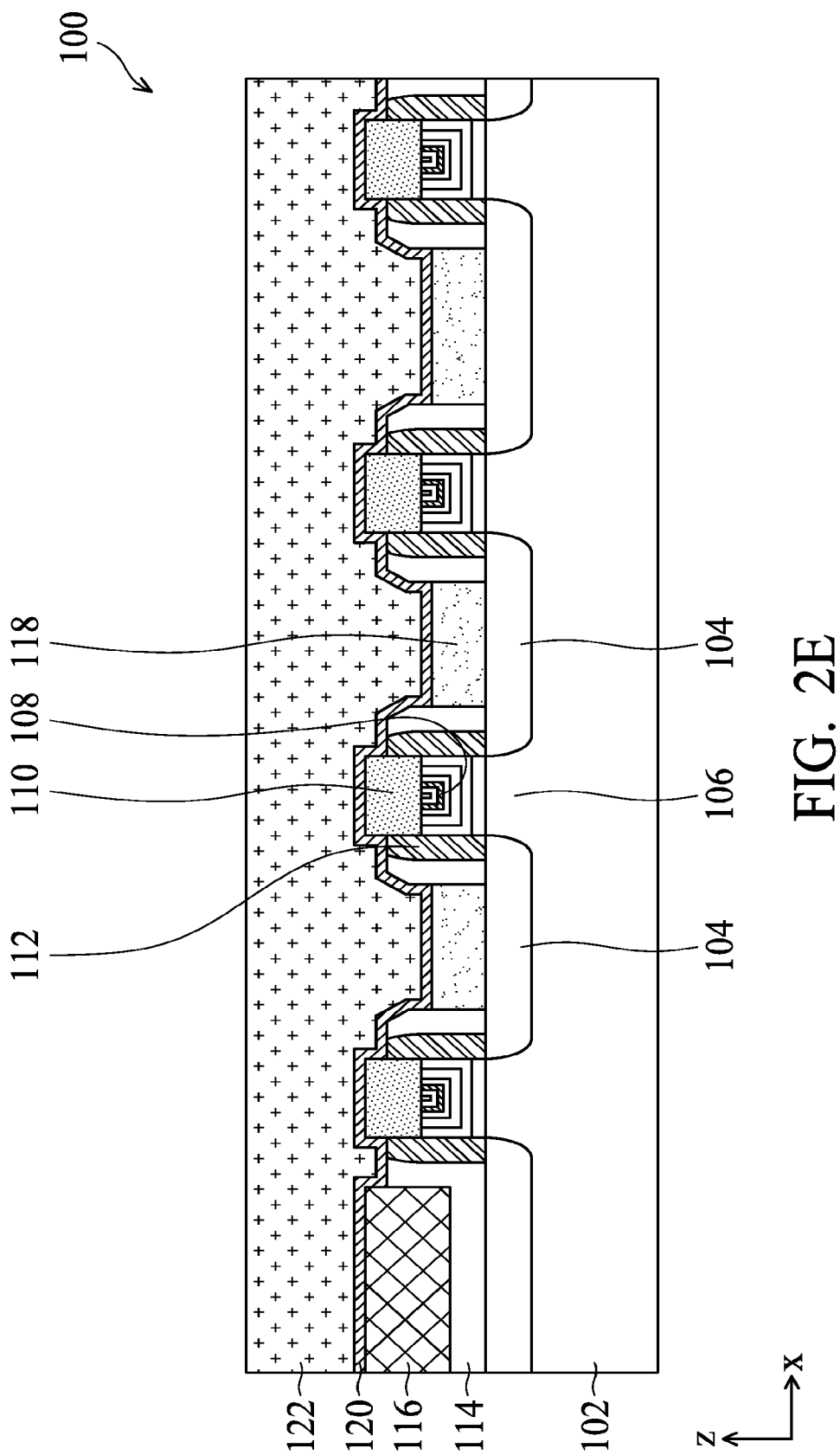

At operation 20, the method 10 (FIG. 1A) forms another dielectric layer 122 over the spacer protection layer 120. Referring to FIG. 2E, the dielectric layer 122 is deposited onto the device 100 and fills various trenches thereon. The dielectric layer 122 may include a metal oxide (e.g., $TiO_2$ and $Al_2O_3$), a metal nitride (e.g., TiN, AlN, AlON, and TaN), or other suitable dielectric materials. In various embodiments, the dielectric layer 122 includes a material different from the spacer protection layer 120. In addition, the dielectric layers 110 and 122 may be of the same or different materials. The dielectric layer 122 may be deposited using PVD, CVD, or other deposition methods.

Figure 2F:
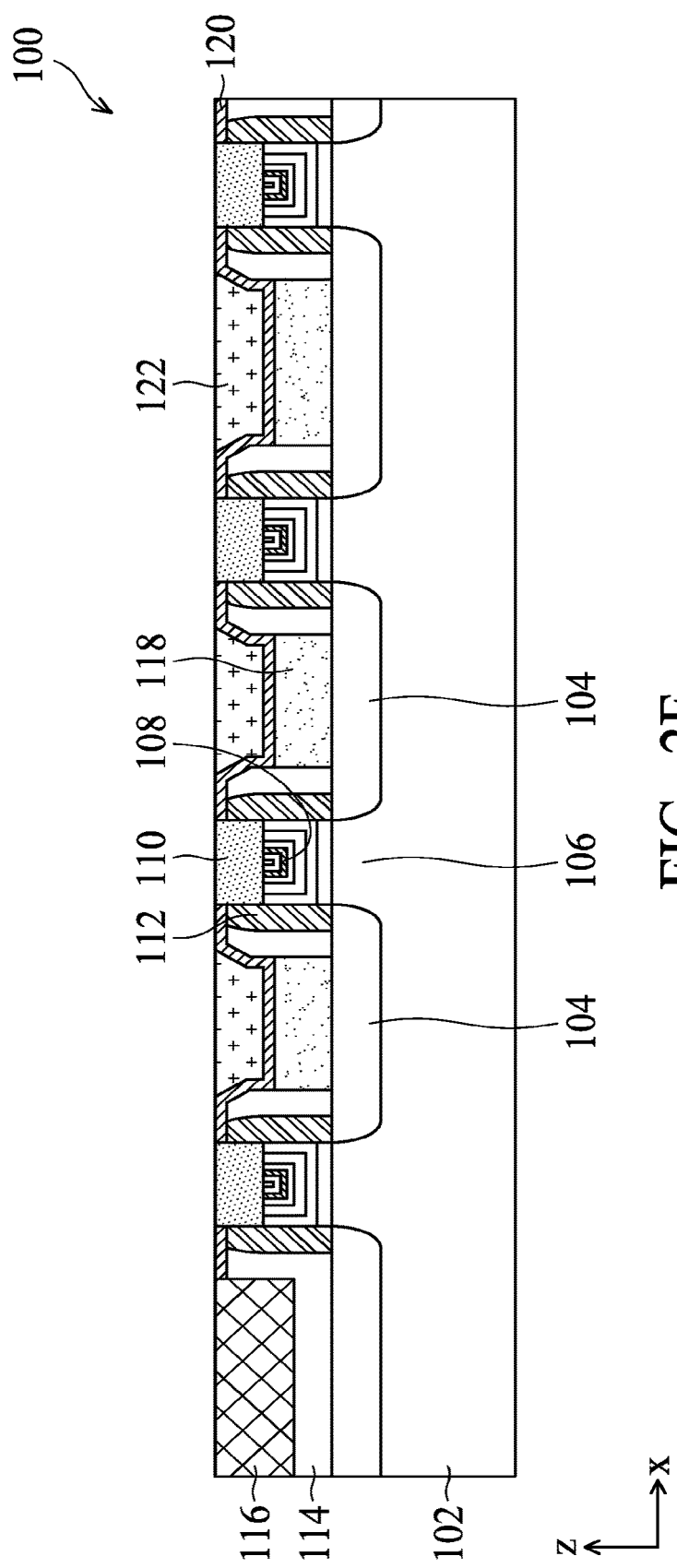

At operation 22, the method 10 (FIG. 1A) recesses the dielectric layer 122 and the spacer protection layer 120 to expose the dielectric layer 110. Referring to FIG. 2F, the dielectric layer 122 is recessed, and portions of the spacer protection layer 120 over the dielectric layer 110 are removed. In an embodiment, operation 22 includes a CMP process for recessing the various layers. In a further embodiment, portions of the ILD layer 116 and portions of the dielectric layer 110 are also removed in the process. In another embodiment where the S/D contacts 118 are not recessed (e.g., operation 16 is not performed), operation 22 may also remove portions of the S/D contacts 118. In yet another embodiment, portions of the spacer protection layer 120 remain on the sidewalls (along the "z" direction) of the dielectric layer 110. In various embodiments, portions of the spacer protection layer 120 over the gate spacer 112 remain substantially unchanged in operation 22.

Figure 2G:
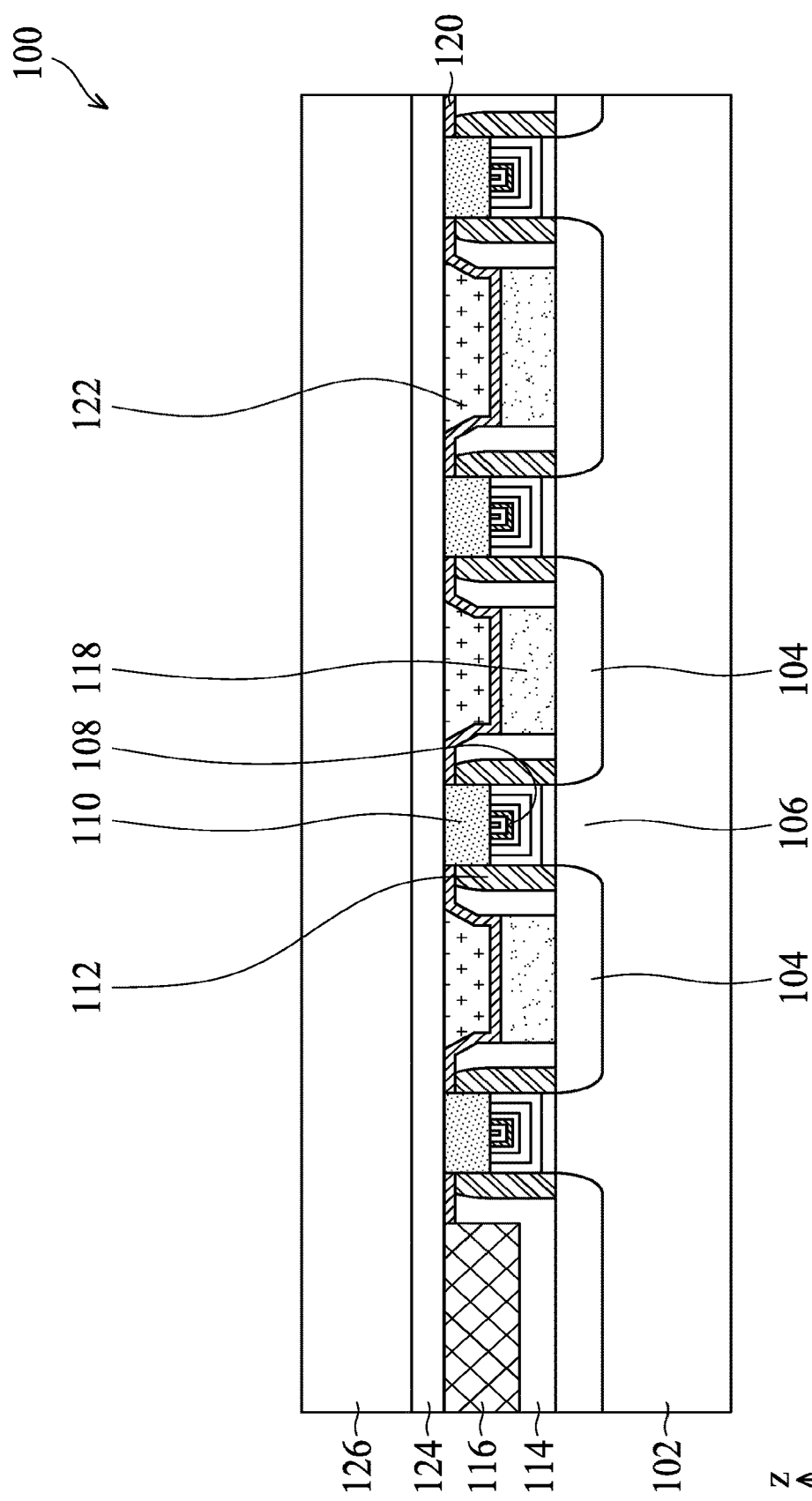

At operation 24, the method 10 (FIG. 1B) forms one or more dielectric layers where first level vias are to be formed. The one or more dielectric layers are referred to as the first level (or level-1) dielectric layer(s) in the present disclosure. Referring to FIG. 2G, in the present embodiment, the first level dielectric layer include a CES layer 124 and an ILD layer 126 over the CES layer 124. The CES layer 124 may include a dielectric material such as SiN, $SiO_2$, and SiON. The ILD layer 126 may include an oxide such as TEOS, BPSG, FSG, PSG, and BSG. The ILD layer 126 and the CES layer 124 may include the same materials as the ILD layer 116 and the CES layer 114 respectively or include different materials. Furthermore, in the present embodiment, the CES layer 124 may include the same material as the dielectric layer 110 and/or the dielectric layer 122. The CES layer 124 may be formed by a PECVD process or other suitable deposition or oxidation processes. The ILD layer 126 may be deposited by a PECVD process, a FCVD process, or other suitable deposition processes.

Figure 2H:
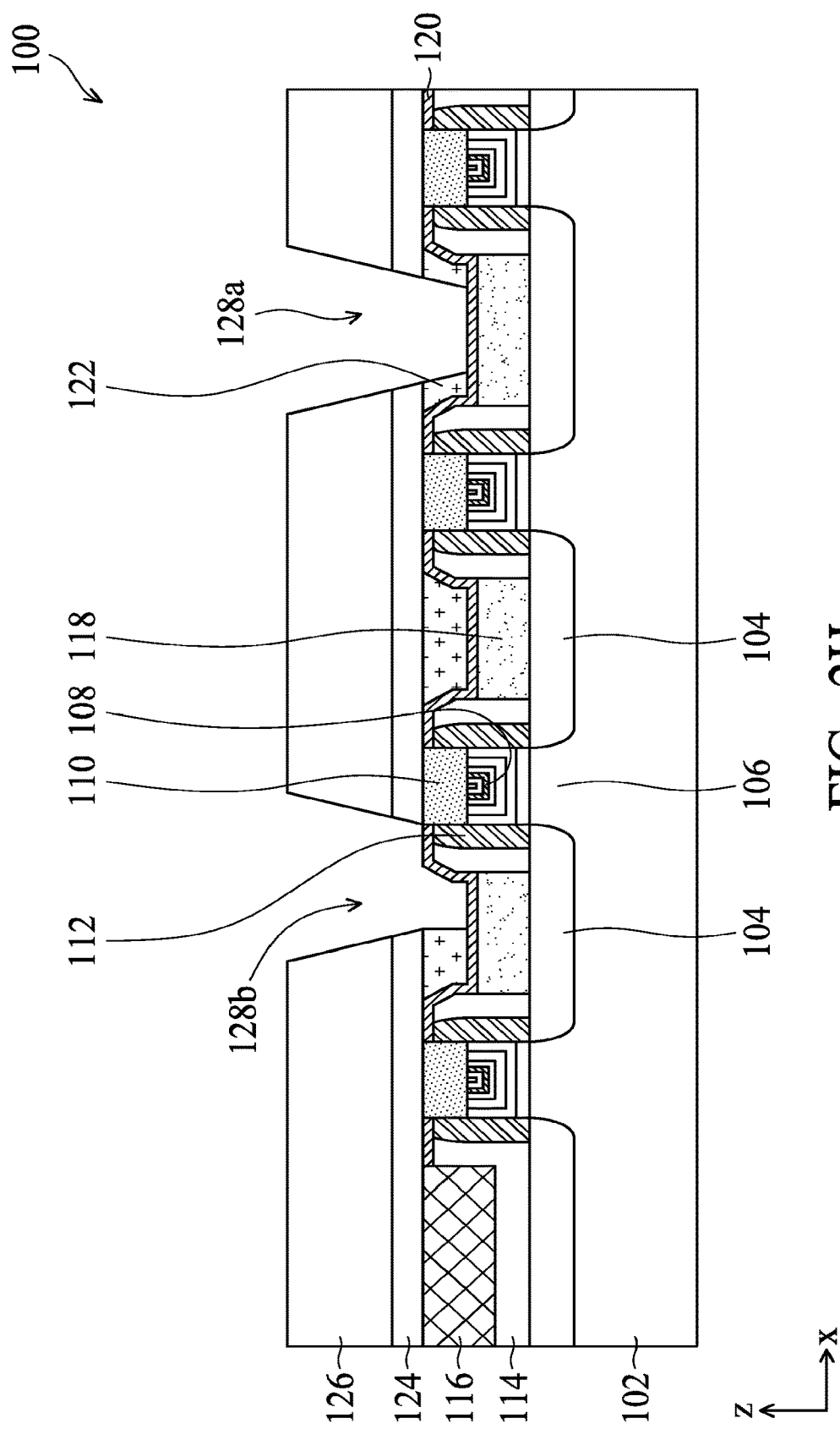

At operation 26, the method 10 (FIG. 1B) etches the various layers to form holes (or trenches) 128a and 128b over the S/D contacts 118. Referring to FIG. 2H, portions of the ILD layer 126, the CES layer 124, and the dielectric layer 122 are removed, and the spacer protection layer 120 is exposed in the holes 128a and 128b. The holes 128a and 128b are formed by a variety of processes including photolithography and etching processes. The photolithography process may include forming a photoresist (or resist) over the ILD layer 126, exposing the resist to a pattern that defines various geometrical shapes for the holes 128a and 128b, performing post-exposure bake processes, and developing the resist to form a masking element including the resist. The masking element, or a derivative thereof, is then used for etching recesses into the various layers including the layers 126, 124, and 122. The masking element (e.g., a patterned resist) is subsequently removed. The etching processes may include one or more dry etching processes, wet etching processes, and other suitable etching techniques. Particularly, operation 26 includes an etching process that is tuned to selectively remove the dielectric layer 122 while the spacer protection layer 120 remains substantially unchanged in the etching process. In an embodiment, the etching process includes an anisotropic etching, such as an anisotropic dry etching process.

In the photolithography process, overlay errors are very difficult, if not impossible, to avoid. The overlay errors refer to the misalignment between the patterns defined by the masking element and the underlying target. For illustration purposes and comparison purposes, FIG. 2H shows that the hole 128a is properly aligned with its target S/D contact 118 while the hole 128b is misaligned with its target S/D contact 118. Particularly, the hole 128b partially overlaps the spacer 112. Without the spacer protection layer 120, the etching process would remove portions of the gate spacer 112 that would be exposed in the hole 128b. One reason is that the gate spacer 112 is typically of a low-k dielectric material that does not have sufficient etch selectivity with respect to the dielectric layer 122. In another word, an etching process that removes the dielectric layer 122 generally removes the gate spacer 112 as well. If the gate spacer 112 is etched away, the gate stack 108 may be shorted with the S/D via (or plug) to be deposited in the hole 128b, creating a device defect. In the present embodiment, the spacer protection layer 120 has sufficient etch selectivity with respect to the dielectric layer 122. As a result, even if photolithography overlay errors occur (as in the example of the hole 128b), the gate spacer 112 is advantageously protected from the etching processes.

Figure 2I:
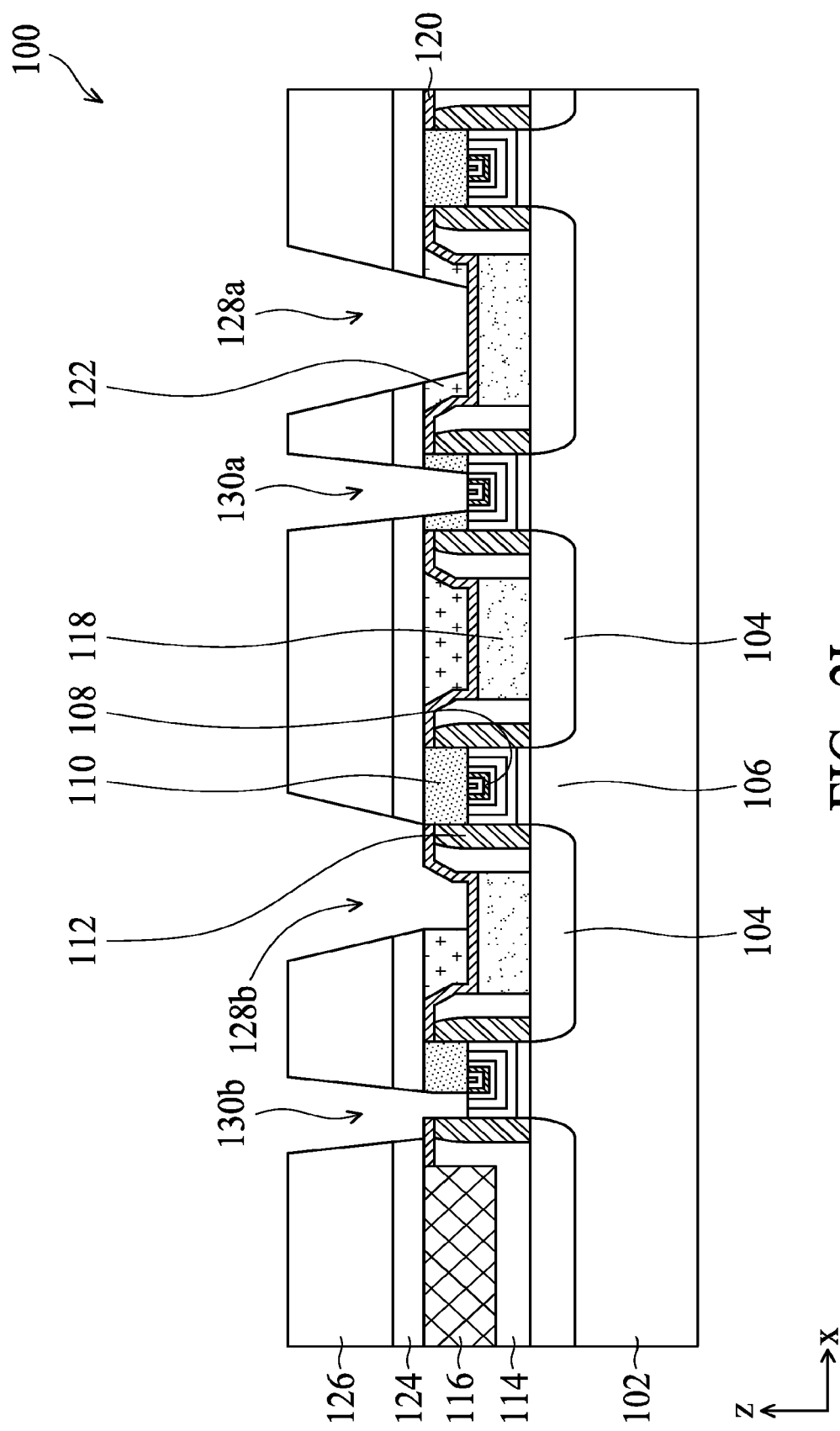

At operation 28, the method 10 (FIG. 1B) etches the various layers to form holes (or trenches) 130a and 130b over the gate stacks 108. Referring to FIG. 2I, the etching process etches the ILD layer 126, the CES layer 124, and the dielectric layer 110 to expose a top surface of the gate stacks 108. In an embodiment, operation 28 includes photolithography and etching processes, similar to operation 26. For example, the photolithography process defines and develops a masking element overlying the ILD layer 126, and the etching process etches the various layers using the masking element as an etch mask to form the holes 130a and 130b. The holes 128a and 128b may be protected from the etching process, for example, by the same masking element. In an embodiment, operation 28 includes multiple selective etching processes. For example, operation 28 includes an etching process that is tuned to selectively remove the CES layer 124 while the spacer protection layer 120 remains substantially unchanged. In the present embodiment, operation 28 includes an etching process that is tuned to selectively remove the dielectric layer 110 while the spacer protection layer 120 remains substantially unchanged. In a further embodiment, the etching process may be an anisotropic etching process, such as an anisotropic dry etching process.

Similar to what has been discussed with reference to operation 26, photolithography overlay errors may cause the holes 130a and/or 130b to be misaligned with the respective gate stacks 108. For illustration purposes and comparison purposes, FIG. 2I shows that the hole 130a is properly aligned with its target gate stack 108 but the hole 130b is misaligned with its target gate stack 108. Particularly, the hole 130b partially overlaps the gate spacer 112. Without the spacer protection layer 120, the etching process would etch away portions of the gate spacer 112 that would be exposed in the hole 130b because the gate spacer 112 does not have sufficient etch selectivity with respect to the dielectric layer 110. Consequently, it would lead to degradation of the gate stack 108's electrical performance, as well as other long-term reliability issues. In the present embodiment, the gate spacer 112 is advantageously protected by the spacer protection layer 120 when the dielectric layer 110 is etched.

Figure 2J:
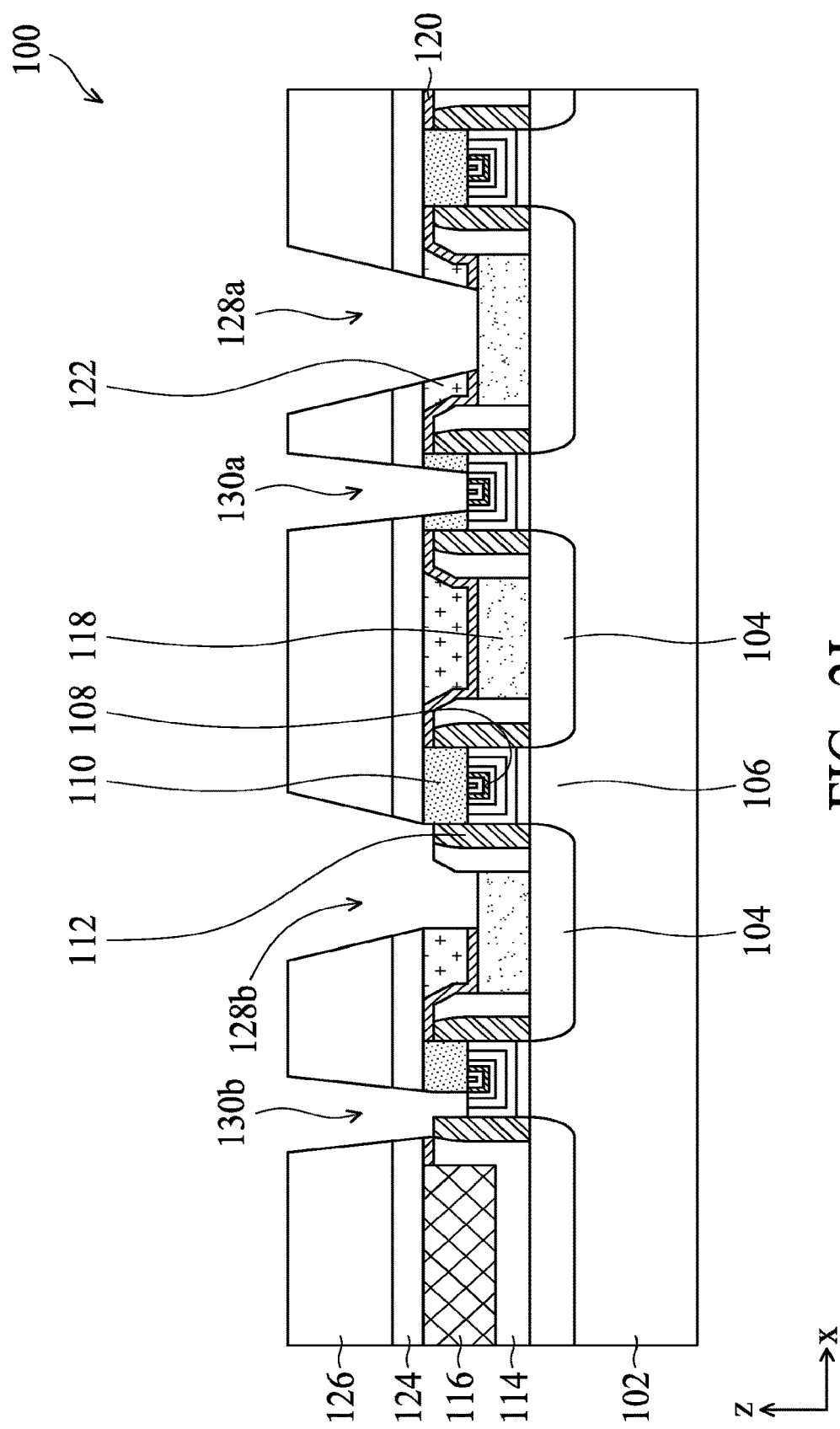
Figure 2K:
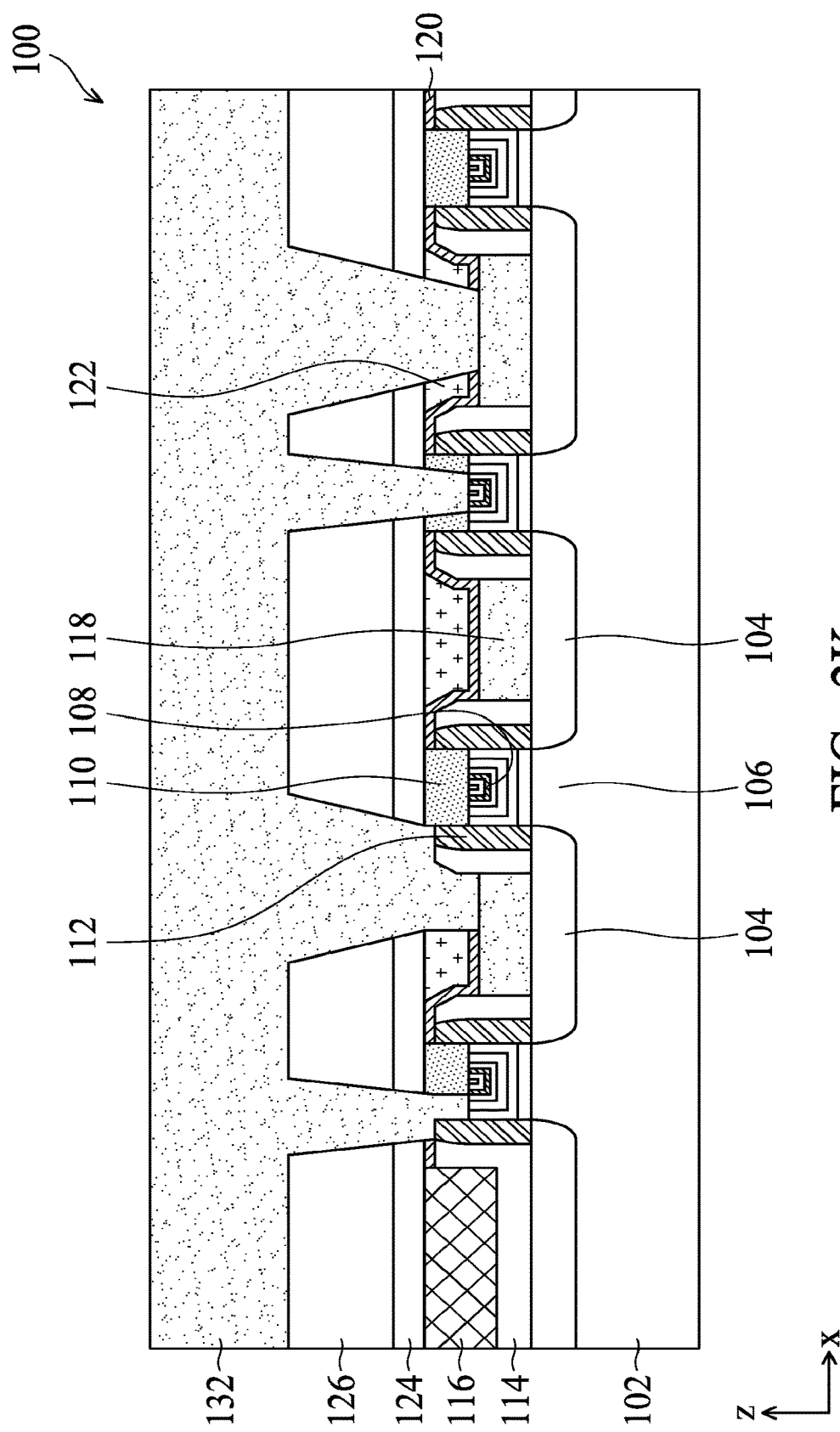

At operation 30, the method 10 (FIG. 1B) removes portions of the spacer protection layer 120, if any, that are exposed in the S/D via holes 128a and 128b and in the gate via holes 130a and 130b. Referring to FIG. 2J, the portions of the spacer protection layer 120 are removed, especially in the S/D via holes 128a and 128b, to expose the S/D contacts 118 thereunder. In an embodiment, the spacer protection layer 120 may be removed by a dry etching process, a wet etching process, or other suitable etching processes. In a further embodiment, the etching process is tuned to selectively remove the spacer protection layer 120 while the gate spacer 112 remains substantially unchanged.

Figure 2L:
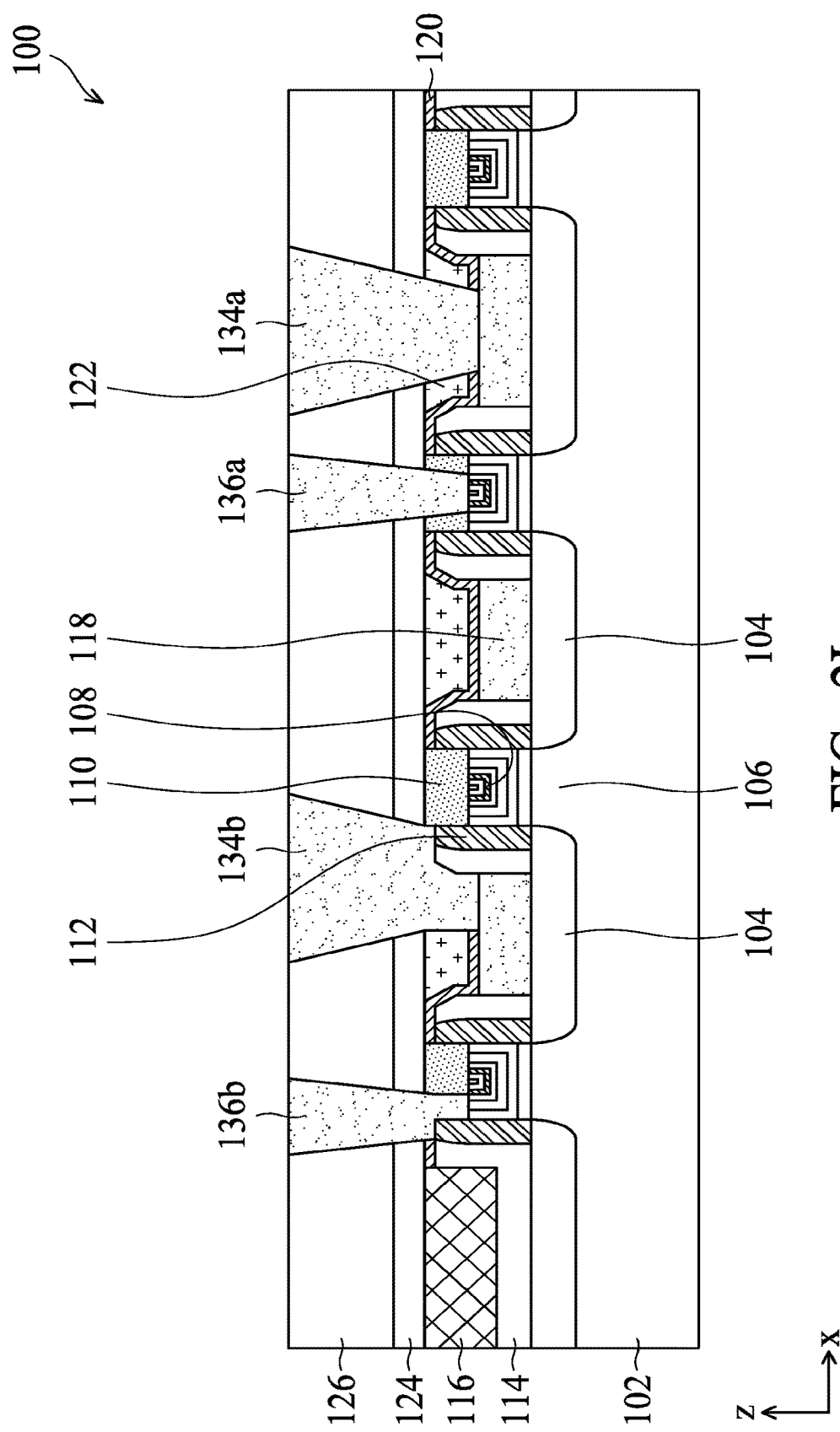

At operation 32, the method 10 (FIG. 1B) forms vias (or plugs) in the holes 128a, 128b, 130a, and 130b. In an embodiment, operation 32 includes depositing a metal 132 over the device 100 filling in the holes (FIG. 2K) and performing a CMP process to remove excessive metal and to planarize a top surface of the device 100 (FIG. 2L). As a result, S/D vias 134a and 134b are formed in the holes 128a and 128b respectively and are in electrical communication with the S/D contacts 118, and gate vias 136a and 136b are formed in the holes 130a and 130b respectively and are in electrical communication with the gate stack 108. The S/D via 134b and the gate via 136b are partially disposed over the respective gate spacer 112. In embodiments, the metal 132 may include aluminum (Al), tungsten (W), cobalt (Co), copper (Cu), and/or other suitable materials. The metal 132 may be formed by CVD, PVD, plating, and/or other suitable processes. As shown in FIG. 2L, the gate spacers 112 remain substantially intact throughout the various etching processes in operations 26 and 28 due to the spacer protection layer 120. Portions of the gate spacer 112 on the opposing sidewalls of each gate stack 108 have about the same height even where the S/D vias 134b and the gate vias 136b are located. Furthermore, portions of the spacer protection layer 120 remain in the device 100. For example, some portions of the spacer protection layer 120 are disposed over the gate spacer 112, the S/D contacts 118, and/or the CES layer 114.

At operation 34, the method 10 (FIG. 1B) proceeds to further steps to complete the fabrication of the device 100. For example, the method 10 may form multi-layer interconnect structure that connects the S/D vias (134a and 134b)

and the gate vias (136a and 136b) with other parts of the device 100 to form a complete IC.

Although not intended to be limiting, one or more embodiments of the present disclosure provide many benefits to a semiconductor device and a formation process thereof. For example, the presence of a spacer protection layer over gate spacers protects the gate spacers in various etching process when forming first level vias (S/D vias and gate vias). The provided subject matter can be easily integrated into existing IC fabrication flow. In addition, the formation method disclosed above tolerates certain process variations and provides a robust solution for semiconductor device fabrication. The present disclosure can be used for fabricating not only planar FETs but also three-dimensional devices and multi-gate devices such as double gate FETs, FinFETs, tri-gate FETs, omega FETs, Gate-All-Around (GAA) devices, and vertical GAA devices.

In one exemplary aspect, the present disclosure is directed to a method of forming a semiconductor device. The method includes providing a precursor that includes a substrate, a gate stack over the substrate, a first dielectric layer over the gate stack, a gate spacer on sidewalls of the gate stack and on sidewalls of the first dielectric layer, and source and drain (S/D) contacts on opposing sides of the gate stack. The method further includes recessing the gate spacer to at least partially expose the sidewalls of the first dielectric layer but not to expose the sidewalls of the gate stack. The method further includes forming a spacer protection layer over the recessed gate spacer, the first dielectric layer, and the S/D contacts.

In another exemplary aspect, the present disclosure is directed to a method of forming a semiconductor device. The method includes providing a precursor that includes a substrate, a gate stack over the substrate, a first dielectric layer over the gate stack, a gate spacer on sidewalls of the gate stack and on sidewalls of the first dielectric layer, and source and drain (S/D) contacts on opposing sides of the gate stack. The method further includes recessing the gate spacer to at least partially expose the sidewalls of the first dielectric layer but not to expose the sidewalls of the gate stack. The method further includes recessing the S/D contacts below a top surface of the first dielectric layer and forming a spacer protection layer over the recessed gate spacer, the first dielectric layer, and the S/D contacts.

In yet another exemplary aspect, the present disclosure is directed to a semiconductor device. The semiconductor device includes a substrate, a gate stack over the substrate, a gate spacer on sidewalls of the gate stack, and source and drain (S/D) contacts separated by the gate stack and the gate spacer. The semiconductor device further includes a spacer protection layer over a portion of the gate spacer. The semiconductor device further includes a gate via over the gate stack and in electrical communication with the gate stack and S/D vias over the S/D contacts and in electrical communication with the S/D contacts.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a gate stack disposed over a substrate, the gate stack including a gate electrode layer and a first dielectric layer disposed over the gate electrode layer;
   a sidewall spacer disposed along a sidewall of the gate stack;
   a first contact disposed over a source/drain feature disposed in the substrate;
   a protection layer extending from a sidewall of the first dielectric layer to the source/drain feature; and
   a second contact extending through the protection layer and the first dielectric layer to the gate electrode such that the second contact physically contacts the protection layer and the first dielectric layer.

2. The device of claim 1, wherein the sidewall spacer has a top surface facing away from the substrate, and
   wherein the second contact physically contacts the top surface of the sidewall spacer.

3. The device of claim 1, wherein the first contact has a top surface facing away from the substrate, and
   wherein the protection layer and the second contact both physically contact the top surface of the first contact.

4. The device of claim 1, further comprising a contact etch stop layer disposed along on the sidewall spacer, and
   wherein the protection layer is disposed over the contact etch stop layer.

5. The device of claim 1, wherein the first dielectric layer extends to a first height over the substrate and the sidewall spacer extends to a second height over the substrate, the second height being different than the first height.

6. The device of claim 1, wherein the first contact has a first sidewall and an opposing second sidewall, and wherein the protection layer physically contacts both the first sidewall and the second sidewall.

7. The device of claim 1, wherein the sidewall spacer has a top surface facing away from the substrate, and
   wherein the protection layer physically contacts the top surface of the sidewall spacer.

8. A device comprising:
   a gate stack disposed over a substrate, the gate stack including a gate electrode layer and a first dielectric layer disposed over the gate electrode layer;
   a sidewall spacer disposed along a sidewall of the gate stack;
   a protection layer disposed along a sidewall of the first dielectric layer such that the protection layer physically contacts the sidewall of the first dielectric layer; and
   a first contact extending through the protection layer and the first dielectric layer to the gate electrode such that the first contact physically contacts the protection layer, the first dielectric layer and the sidewall spacer.

9. The device of claim 8, further comprising a first contact etch stop layer disposed on the sidewall spacer.

10. The device of claim 9, wherein the protection layer physically contacts the first contact etch stop layer.

11. The device of claim 10, further comprising a second contact etch stop layer deposed over the protection layer, wherein the second contact etch stop layer physically contacts the protection layer.

12. The device of claim 8, wherein the first dielectric layer includes a metal oxide material.

13. The device of claim 8, wherein the sidewall spacer includes a sidewall facing a sidewall of the first dielectric layer, and wherein the first contact physically contacts the sidewall of the sidewall spacer and the sidewall of the first dielectric layer.

14. The device of claim 8, further comprising:
a source/drain feature disposed on the substrate;
a second dielectric layer disposed over the source/drain feature; and
a second contact extending through second dielectric layer to the source/drain feature, wherein the second contact physically contacts the protection layer.

15. A device comprising:
a gate stack disposed over a substrate, the gate stack including a gate electrode layer and a first dielectric layer disposed over the gate electrode layer;
a gate spacer disposed on the gate stack;
a spacer protection layer disposed over a portion of the gate spacer and physically contacting the first dielectric layer; and
a gate via extending through the first dielectric layer and the spacer protection layer such that the gate via physically contacts the first dielectric layer and the spacer protection layer.

16. The device of claim 15, further comprising:
a source/drain feature disposed on the substrate; and
a source/drain contact extending to the source/drain feature.

17. The device of claim 16, wherein the source/drain contact extends to a first height above the substrate and the gate spacer extends to a second height above the substrate, the second height being greater than the first height.

18. The device of claim 16, wherein the source/drain contact has a top surface facing away from the substrate and the spacer protection layer physically contacts the top surface of the source/drain contact.

19. The device of claim 15, further comprising:
a second dielectric material layer disposed on a first side of the gate stack; and
a third dielectric material layer disposed on a second side of the gate stack, the second side being opposite the first side and the third dielectric material layer being formed of a different material than the second dielectric material layer, and
wherein the spacer protection layer physically contacts the second dielectric material layer and the third dielectric material layer.

20. The device of claim 15, wherein the first dielectric layer physically contacts the gate electrode layer.

* * * * *